(12) United States Patent
Wang et al.

(10) Patent No.: US 12,142,519 B2
(45) Date of Patent: Nov. 12, 2024

(54) ETCH STOP DETECTION STRUCTURE AND ETCH STOP DETECTION METHOD

(71) Applicant: United Microelectronics Corp., Hsinchu (TW)

(72) Inventors: Runshun Wang, Singapore (SG); Mengkai Zhu, Singapore (SG); Zhuona Ma, Singapore (SG); Hua-Kuo Lee, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 428 days.

(21) Appl. No.: 17/748,047

(22) Filed: May 19, 2022

(65) Prior Publication Data

US 2023/0343639 A1  Oct. 26, 2023

(30) Foreign Application Priority Data

Apr. 22, 2022  (CN) .......................... 202210431449.8

(51) Int. Cl.
*H01L 21/768* (2006.01)
*H01L 21/66* (2006.01)
(Continued)

(52) U.S. Cl.
CPC .... *H01L 21/7682* (2013.01); *H01L 21/76829* (2013.01); *H01L 22/30* (2013.01);
(Continued)

(58) Field of Classification Search
CPC ................ H01L 21/7682; H01L 22/30; H01L 21/76829; H01L 23/53295; H01L 23/5222; H01L 22/34; H01L 22/26; H01L 22/12; H01L 23/5226; H01L 21/743; H01L 23/5329; H01L 23/535; H01L 21/76802; H01L 23/485; H01L 23/5223; H01L 27/1203; H01L 23/53223; H01L 23/4821; H01L 29/66742; H01L 29/66772; H01L 21/764; H01L 21/76232; H01L 29/0649; H01L 29/78603; H01L 21/31111; H01L 29/78654; H01L 21/76264; H01L 21/84; H01L 29/7841; H01L 21/28518; H01L 29/4991; H01L 29/51; H01L 23/3171; H01L 23/315; H01L 21/02167;
(Continued)

(56) References Cited

U.S. PATENT DOCUMENTS 9,881,870 B2   1/2018  Wu et al.
10,211,146 B2  2/2019  He et al.
(Continued)

*Primary Examiner* — Mouloucoulaye Inoussa
(74) *Attorney, Agent, or Firm* — JCIPRNET

(57) ABSTRACT

An etch stop detection structure and an etch stop detection method are provided. The etch stop detection structure includes a substrate, a first dielectric layer, a first stop layer, and a second dielectric layer. The substrate includes a device region and a detection region. The first dielectric layer is located on the substrate. The first stop layer is located on the first dielectric layer. The second dielectric layer is located on the first stop layer. There is a first air gap in the first dielectric layer and the first stop layer in the device region. There is a trench in the second dielectric layer in the detection region. The trench exposes the first stop layer. The etch stop detection structure can be used to detect the etch stop signal.

20 Claims, 10 Drawing Sheets

(51) Int. Cl.
*H01L 23/522* (2006.01)
*H01L 23/532* (2006.01)

(52) U.S. Cl.
CPC ........ *H01L 23/53295* (2013.01); *H01L 22/26* (2013.01); *H01L 23/5226* (2013.01)

(58) Field of Classification Search
CPC ......... H01L 29/66575; H01L 21/31116; H01L 21/28123; H01L 29/78; H01L 29/45; H01L 21/56; H01L 29/7843; H01L 29/665; H01L 23/528; H01L 23/5225; H01L 21/76895; H01L 23/66; H01L 23/642; H01L 2924/0002
See application file for complete search history.

(56) References Cited

U.S. PATENT DOCUMENTS

| | | | |
|---|---|---|---|
| 2008/0042268 A1* | 2/2008 | Yu | H01L 23/53295 257/734 |
| 2017/0330832 A1* | 11/2017 | He | H01L 27/1203 |
| 2017/0345706 A1* | 11/2017 | Tsai | H01L 21/76805 |
| 2018/0130697 A1* | 5/2018 | Jang | H01L 23/528 |
| 2020/0052038 A1* | 2/2020 | Kim | H10N 70/011 |
| 2020/0395459 A1* | 12/2020 | Singh | H01L 21/28518 |
| 2021/0327813 A1* | 10/2021 | Singh | H01L 23/5226 |
| 2021/0391262 A1* | 12/2021 | Chang | H01L 29/41725 |
| 2022/0068766 A1* | 3/2022 | Hsu | H01L 21/02167 |
| 2022/0415804 A1* | 12/2022 | Yao | H01L 23/5329 |

* cited by examiner

ETCH STOP DETECTION STRUCTURE AND ETCH STOP DETECTION METHOD

CROSS-REFERENCE TO RELATED APPLICATION

This application claims the priority benefit of China patent application serial no. 202210431449.8, filed on Apr. 22, 2022. The entirety of the above-mentioned patent application is hereby incorporated by reference herein and made a part of this specification.

BACKGROUND OF THE INVENTION

Field of the Invention

The invention relates to a semiconductor structure and a detection method, and particularly relates to an etch stop detection structure and an etch stop detection method.

DESCRIPTION OF RELATED ART

In some semiconductor structures, the air gap is disposed between the interconnect structures to reduce the parasitic capacitance between the interconnect structures, thereby reducing the resistance-capacitance (RC) delay. However, when the lower air gap and the upper air gap connected to each other are sequentially formed, it is difficult to control the etching endpoint of the etching process in the etching process for forming the upper air gap, so the etching process will cause damage to the semiconductor device located under the lower air gap.

SUMMARY OF THE INVENTION

The invention provides an etch stop detection structure and an etch stop detection method, which can be used to detect the etch stop signal.

The invention provides an etch stop detection structure, which includes a substrate, a first dielectric layer, a first stop layer, and a second dielectric layer. The substrate includes a device region and a detection region. The first dielectric layer is located on the substrate. The first stop layer is located on the first dielectric layer. The second dielectric layer is located on the first stop layer. There is a first air gap in the first dielectric layer and the first stop layer in the device region. There is a trench in the second dielectric layer in the detection region. The trench exposes the first stop layer.

According to an embodiment of the invention, in the etch stop detection structure, the bottom surface of the trench may be higher than the bottom surface of the first stop layer.

According to an embodiment of the invention, in the etch stop detection structure, the trench does not pass through the first stop layer.

According to an embodiment of the invention, in the etch stop detection structure, there may be a second air gap in the second dielectric layer in the device region. The second air gap may be connected to the first air gap.

According to an embodiment of the invention, the etch stop detection structure may further include a second stop layer. The second stop layer is located on the second dielectric layer.

According to an embodiment of the invention, in the etch stop detection structure, the second air gap may pass through the second stop layer. The trench may pass through the second stop layer.

According to an embodiment of the invention, the etch stop detection structure may further include a third dielectric layer. The third dielectric layer is located on the second stop layer.

According to an embodiment of the invention, in the etch stop detection structure, the second air gap may extend into the third dielectric layer. The trench may extend into the third dielectric layer.

According to an embodiment of the invention, in the etch stop detection structure, the detection region may be located beside the device region.

According to an embodiment of the invention, in the etch stop detection structure, the substrate may include a chip region and a scribe line region.

According to an embodiment of the invention, in the etch stop detection structure, the device region may be located in the chip region. The detection region may be located in the chip region or the scribe line region.

The invention provides an etch stop detection method, which includes the following steps. A substrate is provided. The substrate includes a device region and a detection region. A first dielectric layer is formed on the substrate. A first stop layer is formed on the first dielectric layer. A first air gap is formed in the first dielectric layer and the first stop layer in the device region. A second dielectric layer is formed on the first stop layer. A trench exposing the first stop layer is formed in the second dielectric layer in the detection region, and an etch stop signal is obtained.

According to an embodiment of the invention, in the etch stop detection method, the bottom surface of the trench may be higher than the bottom surface of the first stop layer.

According to an embodiment of the invention, in the etch stop detection method, the trench does not pass through the first stop layer.

According to an embodiment of the invention, the etch stop detection method may further include the following step. A second air gap is formed in the second dielectric layer in the device region. The second air gap may be connected to the first air gap.

According to an embodiment of the invention, in the etch stop detection method, the second air gap and the trench may be simultaneously formed.

According to an embodiment of the invention, the etch stop detection method may further include the following step. A second stop layer is formed on the second dielectric layer.

According to an embodiment of the invention, in the etch stop detection method, the second air gap may pass through the second stop layer. The trench may pass through the second stop layer.

According to an embodiment of the invention, the etch stop detection method may further include the following step. A third dielectric layer is formed on the second stop layer.

According to an embodiment of the invention, in the etch stop detection method, the second air gap may extend into the third dielectric layer. The trench may extend into the third dielectric layer.

Based on the above description, in the etch stop detection structure and the etch stop detection method according to the invention, there is a trench in the second dielectric layer in the detection region, and the trench exposes the first stop layer. Therefore, the etch stop signal can be obtained by detecting the signal of the first stop layer exposed by the trench. In this way, when the etching process is performed on the second dielectric layer above the first air gap, the etch stop signal can be used to prevent the etching process from causing damage to the semiconductor device under the first air gap.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 2:
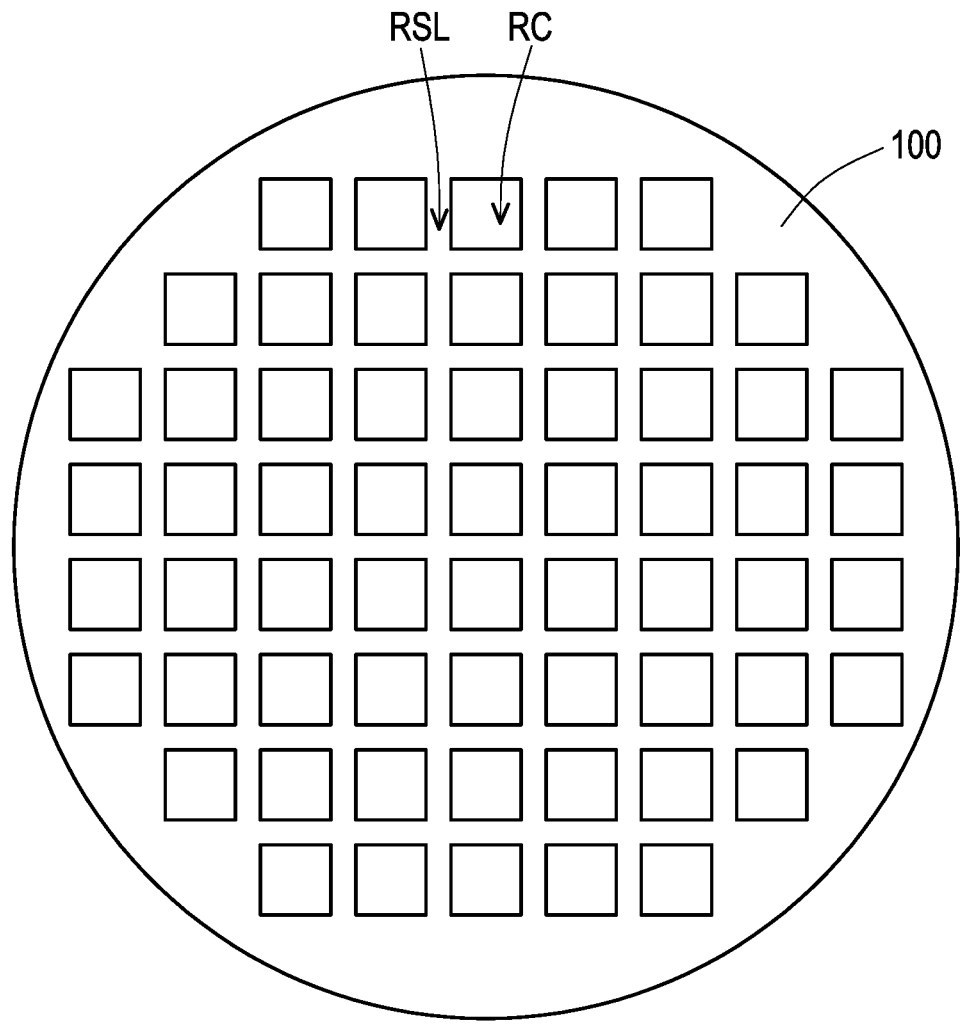
FIG. 2 is a top view illustrating a substrate according to some embodiments of the invention.
Figure 3:
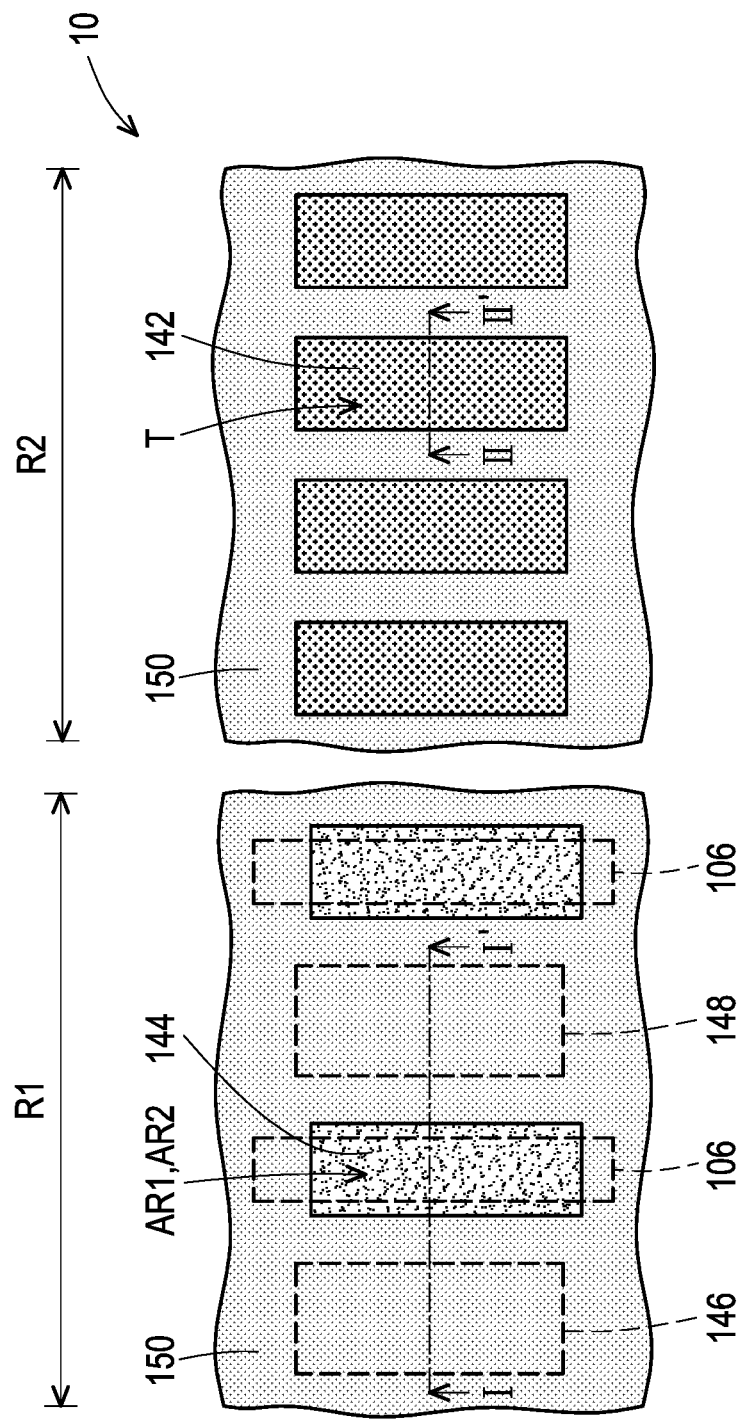
FIG. 3 is a top view of FIG. 1H.

FIG. 1A to FIG. 1H are cross-sectional views illustrating a manufacturing process of an etch stop detection structure according to some embodiments of the invention. FIG. 2 is a top view illustrating a substrate according to some embodiments of the invention. FIG. 3 is a top view of FIG. 1H. FIG. 1A to FIG. 1H are cross-sectional views taken along section line I-I' and section line II-II' in FIG. 3. In the top view of the present embodiment, some components in the cross-sectional view are omitted to clearly illustrate the configuration relationship between the components in the top view.

Figure 1A:
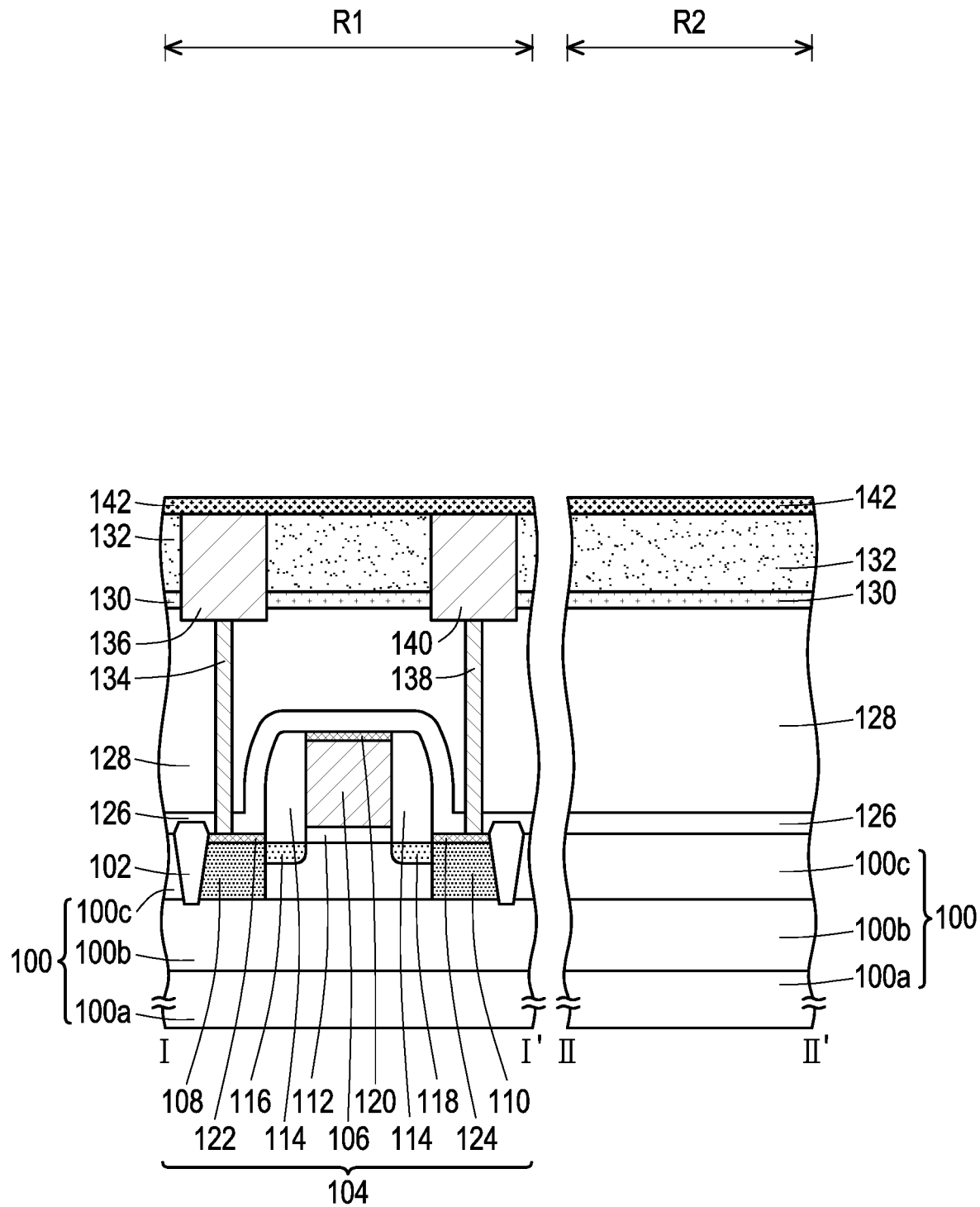
FIG. 1A to FIG. 1H are cross-sectional views illustrating a manufacturing process of an etch stop detection structure according to some embodiments of the invention.

Referring to FIG. 1A, a substrate 100 is provided. The substrate 100 includes a device region R1 and a detection region R2. The detection region R2 may be located beside the device region R1. In some embodiments, as shown in FIG. 2, the substrate 100 may include a chip region RC and a scribe line region RSL. The scribe line region RSL may be used to define the chip region RC. The device region R1 of FIG. 1A may be located in the chip region RC. The detection region R2 of FIG. 1A may be located in the chip region RC or the scribe line region RSL of FIG. 2. In some embodiments, the detection region R2 may be located in a dummy region of the chip region RC. In some embodiments, the substrate 100 may be a semiconductor-on-insulator (SOI) substrate, but the invention is not limited thereto. For example, the substrate 100 may include a substrate layer 100a, an insulating layer 100b, and a semiconductor layer 100c. The material of the substrate layer 100a is, for example, a semiconductor material such as silicon. The insulating layer 100b is located on the substrate layer 100a. The material of the insulating layer 100b is, for example, silicon oxide. The semiconductor layer 100c is located on the insulating layer 100b. The material of the semiconductor layer 100c is, for example, silicon. In some embodiments, an isolation structure 102 may be formed in the substrate 100. The isolation structure 102 is, for example, a shallow trench isolation structure. The material of the isolation structure 102 is, for example, silicon oxide.

In some embodiments, a semiconductor device 104 may be formed on the substrate 100. The semiconductor device 104 may be located in the device region R1. In some embodiments, the semiconductor device 104 may be a transistor device. The semiconductor device 104 may include a gate 106, a source and drain region 108, and a source and drain region 110. The gate 106 is located on the substrate 100. The material of the gate 106 is, for example, doped polysilicon. The source and drain region 108 and the source and drain region 110 are located in the substrate 100 (e.g., semiconductor layer 100c) on two sides of the gate 106. The source and drain region 108 and the source and drain region 110 may be doped regions, respectively. In some embodiments, the source and drain region 108 may be a source region, and the source and drain region 110 may be a drain region. In other embodiments, the source and drain region 108 may be a drain region, and the source and drain region 110 may be a source region. In addition, the semiconductor device 104 may further include a gate dielectric layer 112. The gate dielectric layer 112 is located between the gate 106 and the substrate 100. The material of the gate dielectric layer 112 is, for example, silicon oxide.

In some embodiments, the semiconductor device 104 may further include at least one of a spacer 114, a lightly doped drain region (LDD) 116, an LDD region 118, a metal silicide layer 120, a metal silicide layer 122, and a metal silicide layer 124. The spacer 114 is located on the sidewall of the gate 106. The spacer 114 may be a single-layer structure or a multilayer structure. The material of the spacer 114 is, for example, silicon oxide, silicon nitride, or a combination thereof. The LDD region 116 and the LDD region 118 are located in the substrate 100 (e.g., semiconductor layer 100c) under the spacer 114. The metal silicide layer 120, the metal silicide layer 122, and the metal silicide layer 124 are respectively located on the gate 106, the source and drain region 108, and the source and drain region 110. The materials of the metal silicide layer 120, the metal silicide layer 122, and the metal silicide layer 124 are, for example, cobalt silicide or nickel silicide.

In some embodiments, a stop layer 126 may be formed on the semiconductor device 104, the substrate 100, and isolation structure 102. In some embodiments, the stop layer 126 may be used as an etch stop layer. The material of the stop layer 126 is, for example, silicon nitride (SiN) or silicon carbonitride (SiCN). The method of forming the stop layer 126 is, for example, a chemical vapor deposition (CVD) method. In some embodiments, a dielectric layer 128 may be formed on the stop layer 126. The material of the dielectric layer 128 is, for example, silicon oxide. The method of forming the dielectric layer 128 is, for example, a CVD method. In some embodiments, a stop layer 130 may be formed on dielectric layer 128. In some embodiments, the stop layer 130 may be used as an etch stop layer. The material of the stop layer 130 is, for example, silicon nitride or silicon carbonitride. The method of forming the stop layer 130 is, for example, a CVD method.

A dielectric layer 132 is formed on the substrate 100. In some embodiments, the dielectric layer 132 may be formed on the stop layer 130. The material of the dielectric layer 132 is, for example, a low dielectric constant (low-k) material. The method of forming the dielectric layer 132 is, for example, a CVD method.

In some embodiments, a contact 134, a conductive line 136, a contact 138, and a conductive line 140 may be formed. The contact 134 and the contact 138 are located in dielectric layer 128. The contact 134 and the contact 138 may pass through the stop layer 126 and be electrically connected to the metal silicide layer 122 and the metal silicide layer 124, respectively. The conductive line 136 and the conductive line 140 are located in the dielectric layer 132. The conductive line 136 and the conductive line 140 may pass through the stop layer 130 and be electrically connected to the contact 134 and the contact 138, respectively. The materials of the contact 134, the contact 138, the conductive line 136, and the conductive line 140 are, for example, conductive materials such as metal.

A stop layer 142 is formed on the dielectric layer 132. In some embodiments, the stop layer 142 may be further formed on the conductive line 136 and the conductive line 140. In some embodiments, the stop layer 142 may be used as an etch stop layer. The material of the stop layer 142 is, for example, silicon nitride or silicon carbonitride. The method of forming the stop layer 142 is, for example, a CVD method.

Figure 1B:
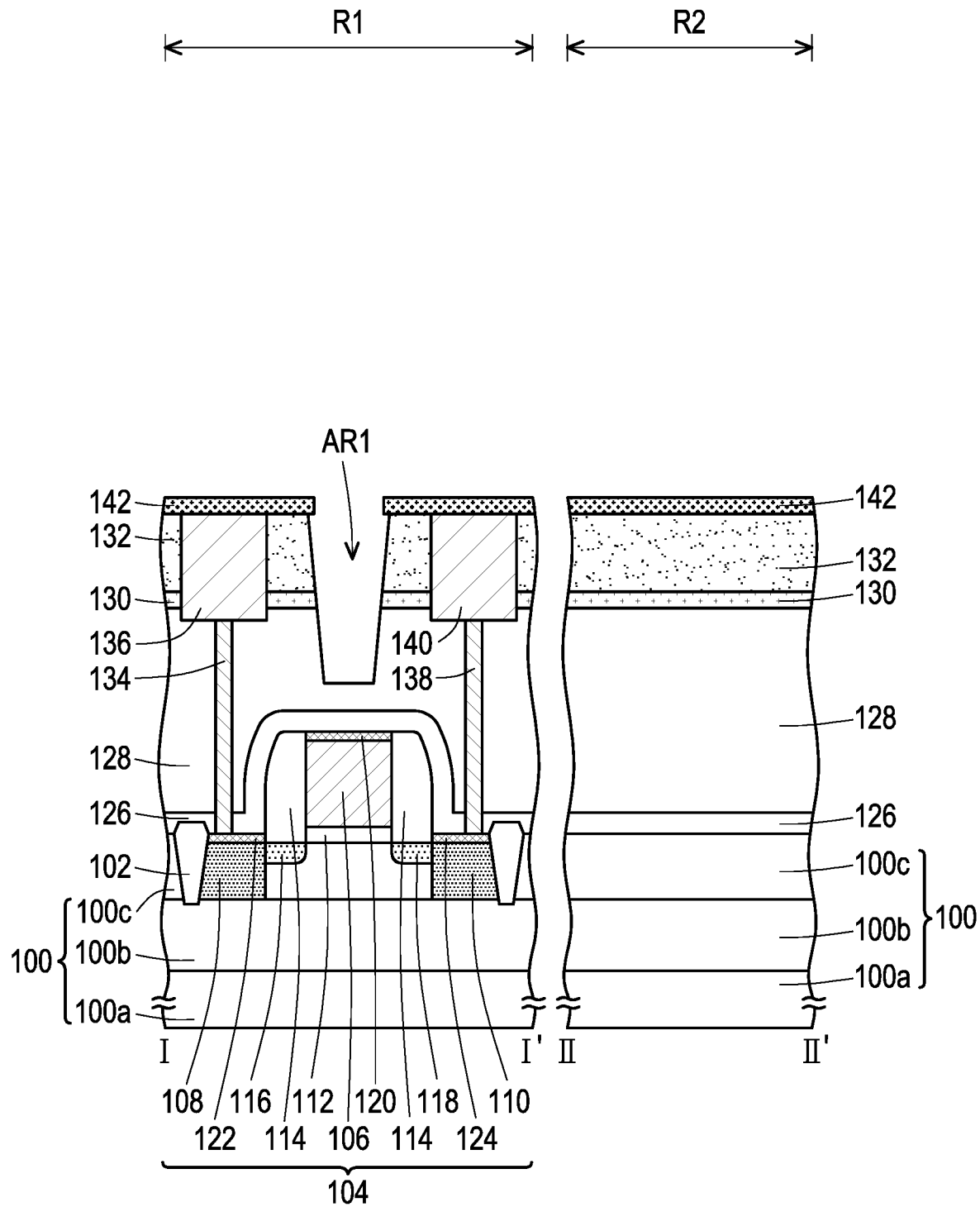

Referring to FIG. 1B, an air gap AR1 is formed in the dielectric layer 132 and the stop layer 142 in the device region R1. In some embodiments, the air gap AR1 may be further formed in the dielectric layer 128 and the stop layer 130. In some embodiments, the stop layer 142, the dielectric layer 132, the stop layer 130, and the dielectric layer 128 may be patterned by a lithography process and an etching process (e.g., dry etching process) to form the air gap AR1.

Figure 1C:
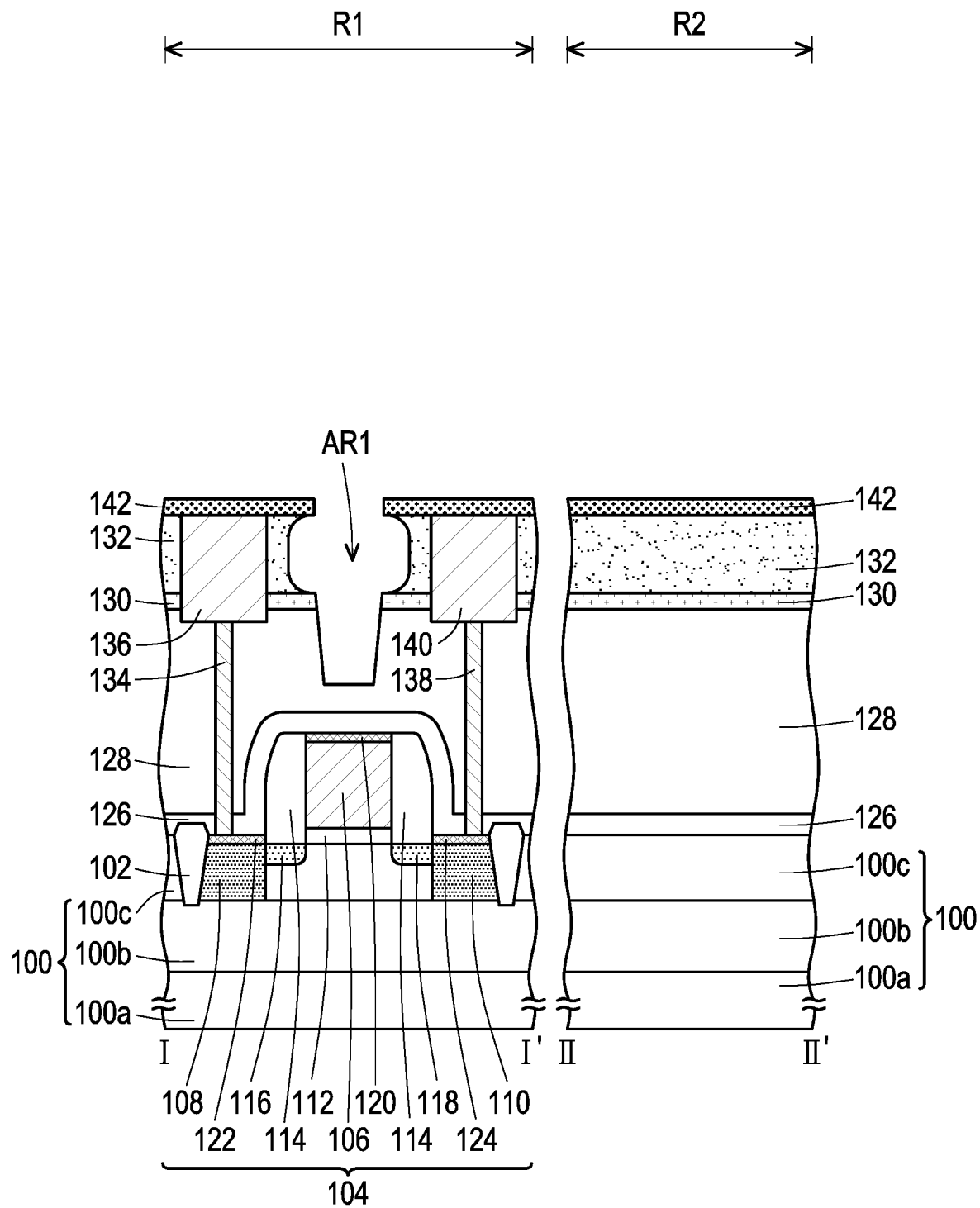

Referring to FIG. 1C, a portion of the dielectric layer 132 may be removed to enlarge the width of the air gap AR1. The method of removing a portion of the dielectric layer 132 is, for example, a wet etching method.

Figure 1D:
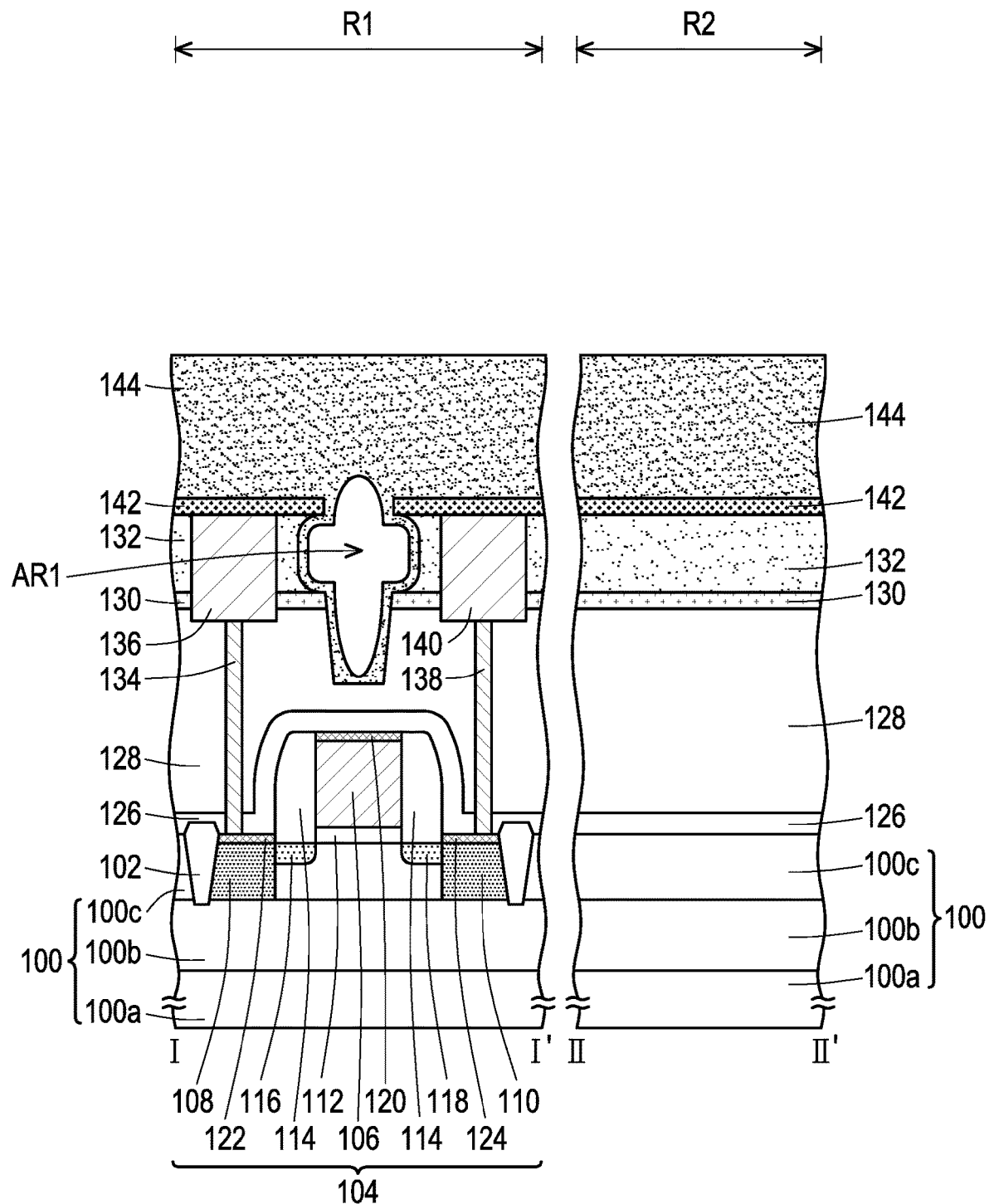

Referring to FIG. 1D, a dielectric layer 144 is formed on the stop layer 142. In some embodiments, the dielectric layer 144 may be further formed in the air gap AR1, and the dielectric layer 144 does not completely fill the air gap AR1. The material of the dielectric layer 144 is, for example, a low-k material. The method of forming the dielectric layer 144 is, for example, a CVD method. In some embodiments, a planarization process may be performed on the dielectric layer 144. The planarization process is, for example, a chemical mechanical polishing (CMP) process.

Figure 1E:
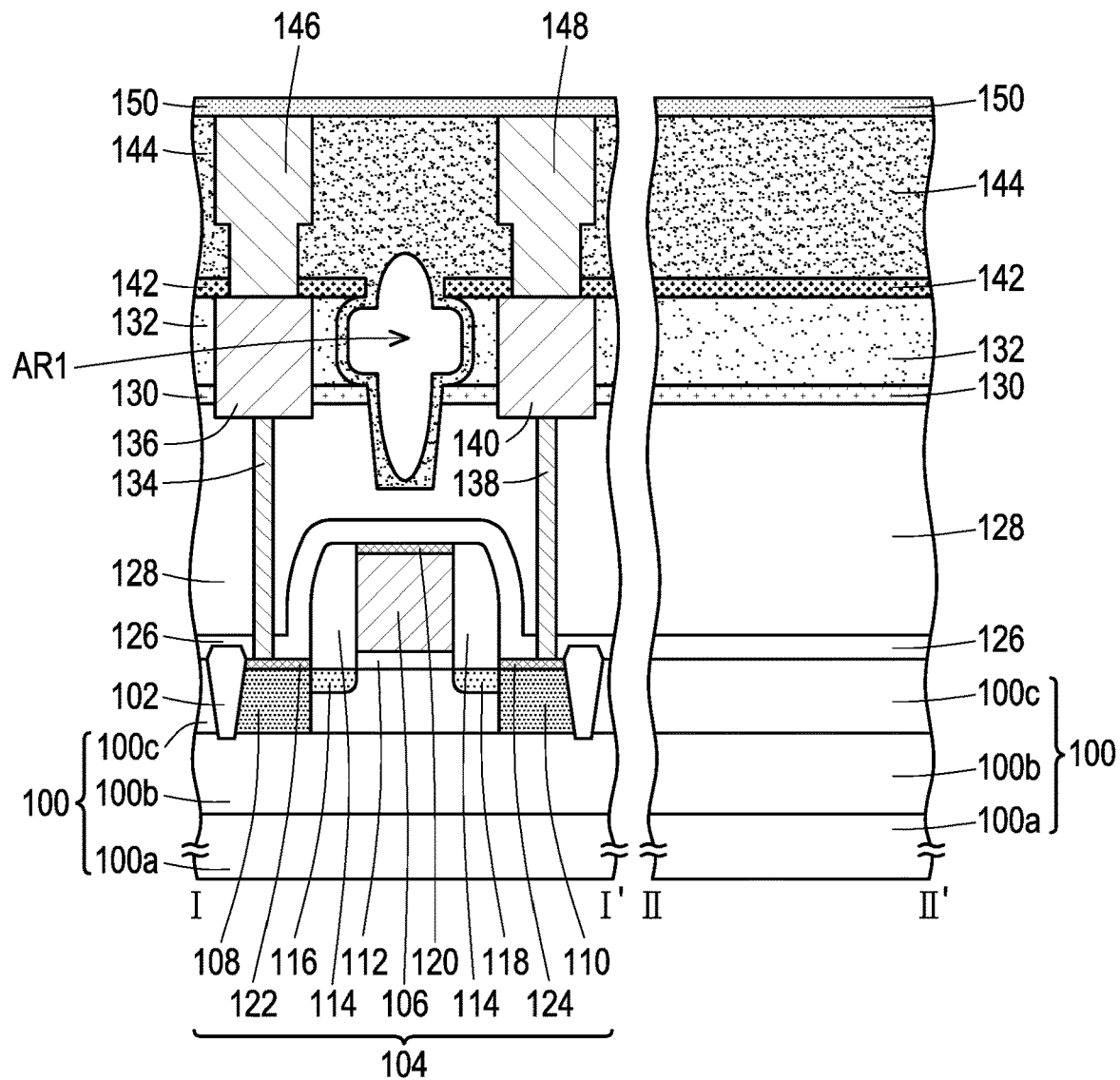

Referring to FIG. 1E, an interconnect 146 and an interconnect 148 may be formed. The interconnect 146 and the interconnect 148 are located in the dielectric layer 144. Each of the interconnect 146 and the interconnect 148 may include a via, a conductive line, or a combination thereof. The interconnect 146 and the interconnect 148 may pass through the stop layer 142 and be electrically connected to the conductive line 136 and the conductive line 140, respectively. The materials of the interconnect 146 and the interconnect 148 are, for example, conductive materials such as metal.

By the above method, an interconnect structure IS1 and an interconnect structure IS2 may be formed. The interconnect structure IS1 and the interconnect structure IS2 may be located in the device region R1. The interconnect structure IS1 may be electrically connected to the source and drain region 108 by the metal silicide layer 122. The interconnect structure IS1 may include the contact 134, the conductive line 136, and the interconnect 146. The conductive line 136 is located on the contact 134, and the interconnect 146 is located on the conductive line 136. In addition, the interconnect structure IS2 may be electrically connected to the source and drain region 110 by the metal silicide layer 124. The interconnect structure IS2 may include the contact 138, the conductive line 140, and the interconnect 148. The conductive line 140 is located on the contact 138, and the interconnect 148 is located on the conductive line 140. Furthermore, the interconnect structure IS1 and the interconnect structure IS2 may be formed by an interconnect process.

A stop layer 150 may be formed on the dielectric layer 144. In some embodiments, the stop layer 150 may be further formed on the interconnect 146 and the interconnect 148. In some embodiments, the stop layer 150 may be used as an etch stop layer. The material of the stop layer 150 is, for example, silicon nitride or silicon carbonitride. The method of forming the stop layer 150 is, for example, a CVD method.

Figure 1F:
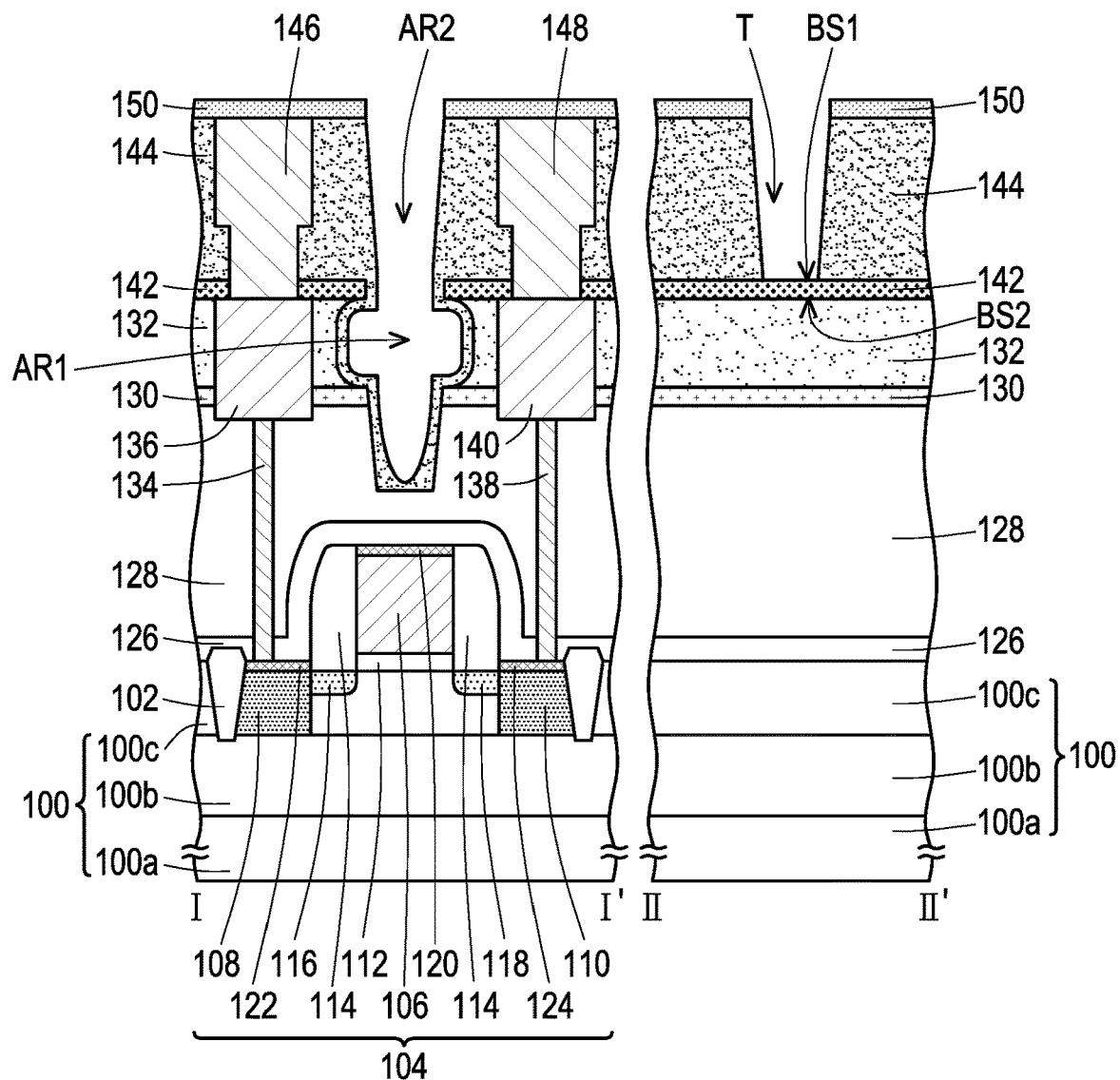

Referring to FIG. 1F, a trench T exposing the stop layer 142 is formed in the dielectric layer 144 in the detection region R2, and an etch stop signal is obtained. In some embodiments, the etch stop detection method can obtain the etch stop signal by detecting the signal of the stop layer 142 exposed by the trench T. The trench T may pass through the stop layer 150. The bottom surface BS1 of the trench T may be higher than the bottom surface BS2 of the stop layer 142. In some embodiments, the trench T does not pass through the stop layer 142. Moreover, an air gap AR2 may be formed in the dielectric layer 144 in the device region R1. The air gap AR2 may be connected to the air gap AR1. The air gap AR2 may pass through the stop layer 150. The air gap AR2 and trench T may be simultaneously formed. In some embodiments, the stop layer 150 and the dielectric layer 144 may be patterned by a lithography process and an etching process (e.g., dry etching process) to form the trench T and the air gap AR2. In addition, when the etching process (e.g., dry etching process) is performed on the dielectric layer 144 above the air gap AR1, the etch stop signal can be used to prevent the etching process from causing damage to the semiconductor device 104 under the air gap AR1.

Figure 1G:
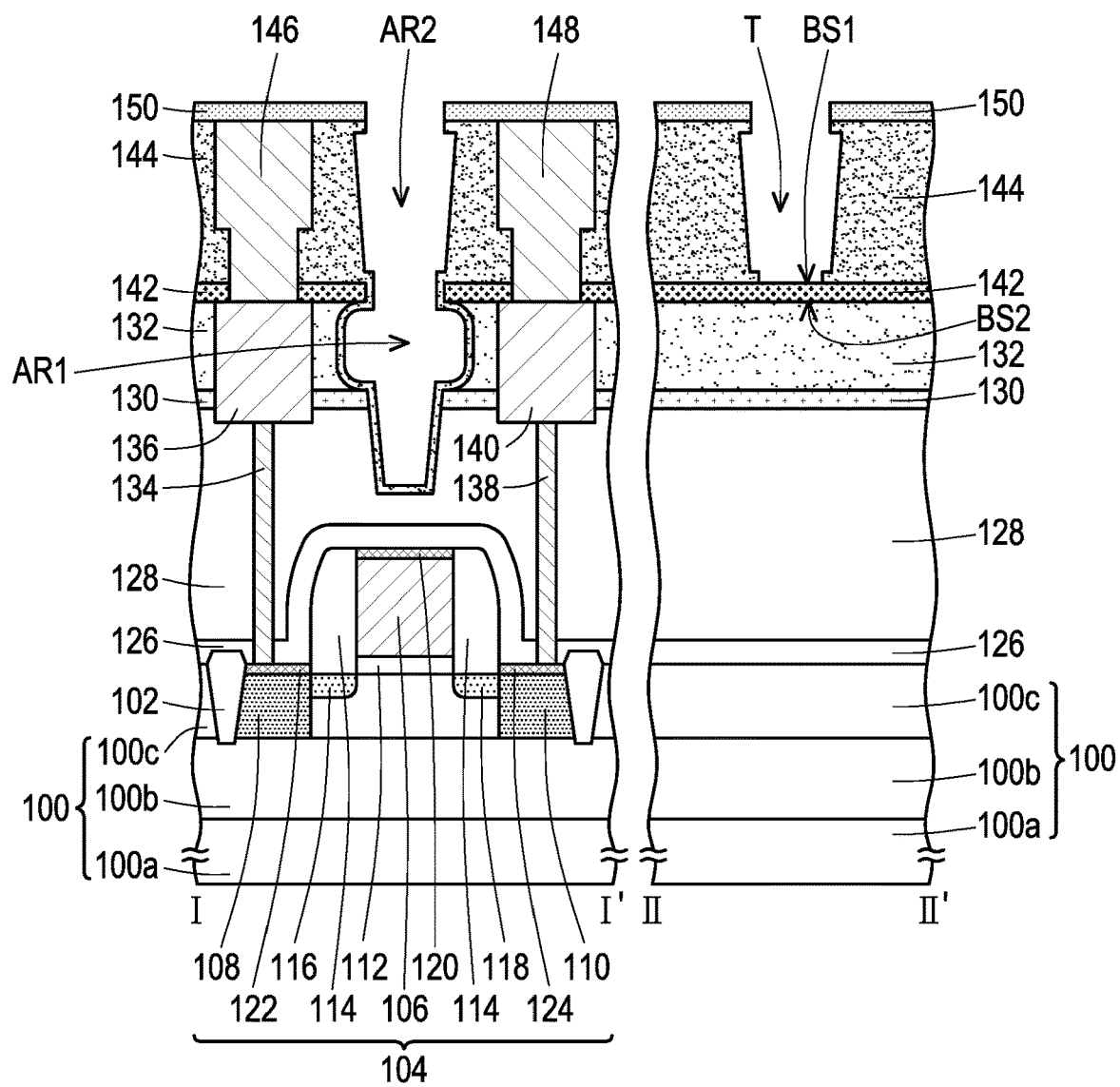

Referring to FIG. 1G, a portion of the dielectric layer 144 may be removed to enlarge the width of the air gap AR2 and/or the width of the trench T. In some embodiments, a method of removing a portion of the dielectric layer 144 is, for example, a wet etching method.

Figure 1H:
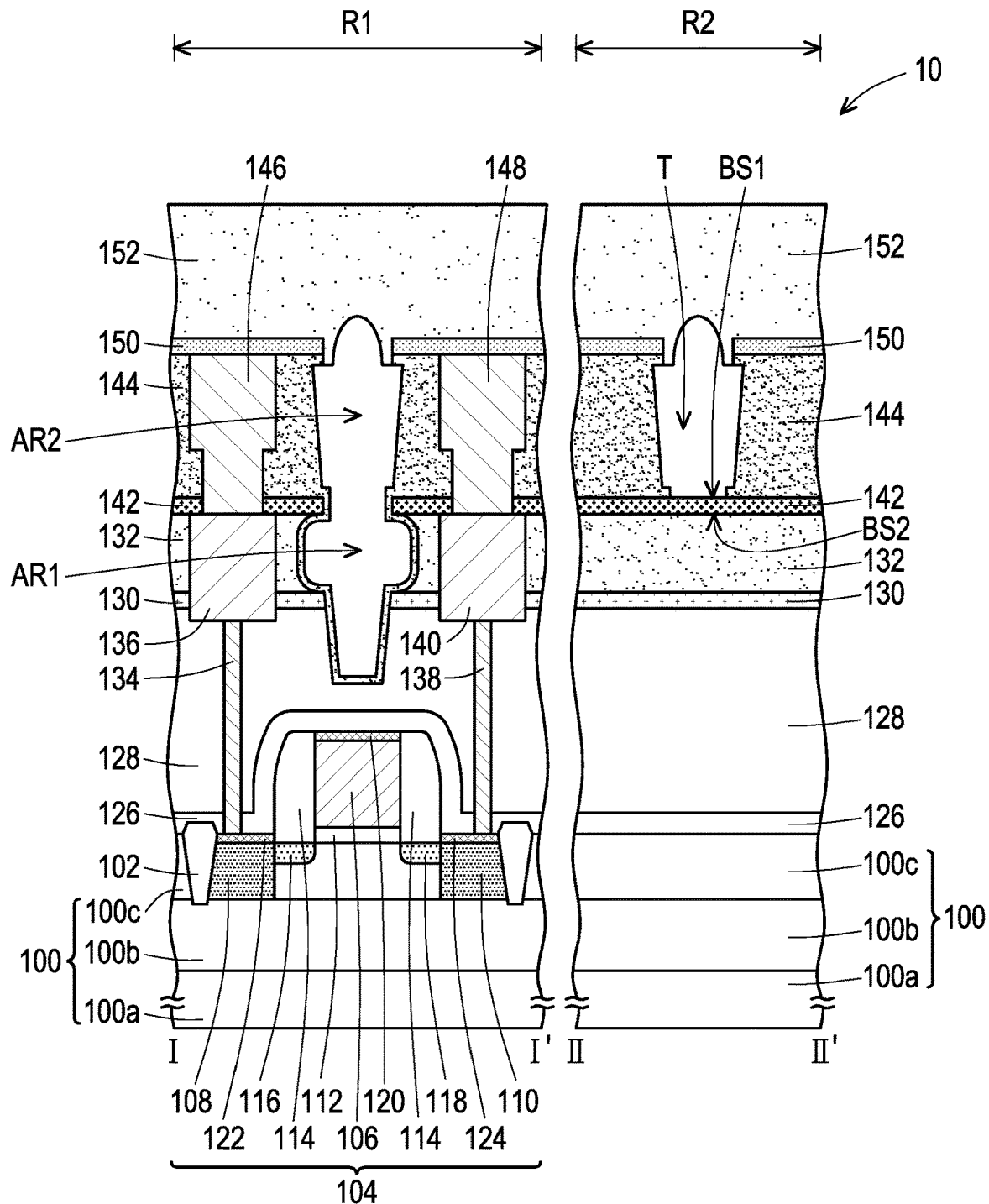

Referring to FIG. 1H, a dielectric layer 152 is formed on the stop layer 150. In some embodiments, the dielectric layer 152 may be further formed in the air gap AR2 and the trench T, and the dielectric layer 152 does not completely fill the air gap AR2 and the trench T. In the present embodiment, the dielectric layer 152 is not formed in the air gap AR1, but the invention is not limited thereto. In other embodiments, the dielectric layer 152 may be formed in the air gap AR1, and the dielectric layer 152 does not completely fill the air gap AR1. In some embodiments, the air gap AR2 may extend into the dielectric layer 152. In some embodiments, the trench T may extend into the dielectric layer 152. The material of the dielectric layer 152 is, for example, a low-k material. The method of forming the dielectric layer 152 is, for example, a CVD method. In some embodiments, a planarization process may be performed on the dielectric layer 152. The planarization process is, for example, a CMP process.

Hereinafter, the etch stop detection structure 10 of the present embodiment is described with reference to FIG. 1H. In addition, although the method of forming the etch stop detection structure 10 is described by taking the above method as an example, the invention is not limited thereto.

Referring to FIG. 1H, FIG. 2, and FIG. 3, an etch stop detection structure 10 includes a substrate 100, a dielectric layer 132, a stop layer 142, and a dielectric layer 144. The substrate 100 includes a device region R1 and a detection region R2. The detection region R2 may be located beside the device region R1. The substrate 100 may include a chip region RC and a scribe line region RSL. The scribe line region RSL may be used to define the chip region RC. The device region R1 may be located in the chip region RC. The detection region R2 may be located in the chip region RC or the scribe line region RSL. In some embodiments, the detection region R2 may be located in a dummy region of the chip region RC. The dielectric layer 132 is located on the substrate 100. The stop layer 142 is located on the dielectric layer 132. The dielectric layer 144 is located on the stop layer 142. There is an air gap AR1 in the dielectric layer 132 and the stop layer 142 in device region R1. There is a trench T in the dielectric layer 144 in the detection region R2. The trench T exposes the stop layer 142. The bottom surface BS1 of the trench T may be higher than the bottom surface BS2 of the stop layer 142. In some embodiments, the trench T does not pass through the stop layer 142. In some embodiments, there may be an air gap AR2 in the dielectric layer 144 in the device region R1. The air gap AR2 may be connected to the air gap AR1.

In addition, the etch stop detection structure 10 may further include at least one of a stop layer 150 and a dielectric layer 152. The stop layer 150 is located on the dielectric layer 144. The air gap AR2 may pass through the stop layer 150. The trench T may pass through the stop layer 150. The dielectric layer 152 is located on the stop layer 150. The air gap AR2 may extend into the dielectric layer 152. The trench T may extend into the dielectric layer 152.

In addition, the remaining contents of the etch stop detection structure 10 can be referred to the description of the above-mentioned embodiments, and the description is not repeated here.

Based on the above embodiments, in the etch stop detection structure 10 and the etch stop detection method, there is a trench T in the dielectric layer 144 in the detection region R2, and the trench T exposes the stop layer 142. Therefore, the etch stop signal can be obtained by detecting the signal of the stop layer 142 exposed by the trench T. In this way, when the etching process is performed on the dielectric layer 144 above the air gap AR1, the etch stop signal can be used to prevent the etching process from causing damage to the semiconductor device 104 under the air gap AR1. In some embodiments, when the detection region R2 is located in the scribe line region RSL, since the trench T does not occupy the area of the chip region RC, the trench T can be designed to have a larger area, thereby improving the signal strength of the etch stop signal.

In summary, in the etch stop detection structure and the etch stop detection method of the aforementioned embodiments, there is a trench exposing the stop layer in the detection region. Therefore, the etch stop signal can be obtained by detecting the signal of the stop layer exposed by the trench. In this way, the etch stop signal can be used to prevent the etching process from causing damage to the semiconductor device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An etch stop detection structure, comprising:
   a substrate comprising a device region and a detection region;
   a first dielectric layer located on the substrate;
   a first stop layer located on the first dielectric layer; and
   a second dielectric layer located on the first stop layer, wherein
   there is a first air gap in the first dielectric layer and the first stop layer in the device region,
   there is a trench in the second dielectric layer in the detection region, and
   the trench exposes the first stop layer.

2. The etch stop detection structure according to claim 1, wherein a bottom surface of the trench is higher than a bottom surface of the first stop layer.

3. The etch stop detection structure according to claim 1, wherein the trench does not pass through the first stop layer.

4. The etch stop detection structure according to claim 1, wherein
   there is a second air gap in the second dielectric layer in the device region, and
   the second air gap is connected to the first air gap.

5. The etch stop detection structure according to claim 4, further comprising:
   a second stop layer located on the second dielectric layer.

6. The etch stop detection structure according to claim 5, wherein
   the second air gap passes through the second stop layer, and
   the trench passes through the second stop layer.

7. The etch stop detection structure according to claim 5, further comprising:
   a third dielectric layer located on the second stop layer.

8. The etch stop detection structure according to claim 7, wherein
   the second air gap extends into the third dielectric layer, and
   the trench extends into the third dielectric layer.

9. The etch stop detection structure according to claim 1, wherein the detection region is located beside the device region.

10. The etch stop detection structure according to claim 1, wherein the substrate comprises a chip region and a scribe line region.

11. The etch stop detection structure according to claim 10, wherein
    the device region is located in the chip region, and
    the detection region is located in the chip region or the scribe line region.

12. An etch stop detection method, comprising:
    providing a substrate, wherein the substrate comprises a device region and a detection region;
    forming a first dielectric layer on the substrate;
    forming a first stop layer on the first dielectric layer;
    forming a first air gap in the first dielectric layer and the first stop layer in the device region;
    forming a second dielectric layer on the first stop layer; and
    forming a trench exposing the first stop layer in the second dielectric layer in the detection region and obtaining an etch stop signal.

13. The etch stop detection method according to claim 12, wherein a bottom surface of the trench is higher than a bottom surface of the first stop layer.

14. The etch stop detection method according to claim 12, wherein the trench does not pass through the first stop layer.

15. The etch stop detection method according to claim 12, further comprising:
    forming a second air gap in the second dielectric layer in the device region, wherein the second air gap is connected to the first air gap.

16. The etch stop detection method according to claim 15, wherein the second air gap and the trench are simultaneously formed.

17. The etch stop detection method according to claim 15, further comprising:
    forming a second stop layer on the second dielectric layer.

18. The etch stop detection method according to claim 17, wherein
    the second air gap passes through the second stop layer, and
    the trench passes through the second stop layer.

19. The etch stop detection method according to claim 17, further comprising:
    forming a third dielectric layer on the second stop layer.

20. The etch stop detection method according to claim 19, wherein
    the second air gap extends into the third dielectric layer, and
    the trench extends into the third dielectric layer.

* * * * *